United States Patent
Chen et al.

(10) Patent No.: US 8,185,806 B2
(45) Date of Patent: May 22, 2012

(54) EDC GENERATING CIRCUIT AND EDC GENERATING METHOD CORRECTING EDC GENERATED FROM MAIN DATA ACCORDING TO HEADER

(75) Inventors: Chien-Chih Chen, Taipei (TW); Shieh-Hsing Kuo, Taipei County (TW)

(73) Assignee: Realtek Semiconductor Corp., Science Park, HsinChu (TW)

( * ) Notice: Subject to any disclaimer, the term of this patent is extended or adjusted under 35 U.S.C. 154(b) by 1148 days.

(21) Appl. No.: 12/023,048

(22) Filed: Jan. 31, 2008

(65) Prior Publication Data

US 2008/0184091 A1    Jul. 31, 2008

(30) Foreign Application Priority Data

Jan. 31, 2007  (TW) .............................. 96103536 A (51) Int. Cl.
*H03M 13/00*   (2006.01)
(52) U.S. Cl. ........................................ 714/781; 714/758
(58) Field of Classification Search .................. 714/781, 714/758
See application file for complete search history.

(56) References Cited

U.S. PATENT DOCUMENTS

| | | | |
|---|---|---|---|
| 5,200,943 A * | 4/1993 | Sano et al. ................. | 369/47.22 |
| 6,253,349 B1 * | 6/2001 | Maeda et al. ................. | 714/799 |
| 6,510,490 B2 * | 1/2003 | Fuma et al. .................... | 711/113 |
| 6,516,064 B1 * | 2/2003 | Osawa et al. ................. | 380/201 |
| 6,751,771 B2 * | 6/2004 | Chuang et al. ................ | 714/784 |
| 6,993,600 B1 * | 1/2006 | Vo et al. .......................... | 710/33 |
| 7,055,082 B2 * | 5/2006 | Mori et al. ..................... | 714/768 |
| 7,225,385 B2 | 5/2007 | Lin | |
| 7,334,180 B2 | 2/2008 | Peng | |
| 7,380,194 B2 * | 5/2008 | Kojima ......................... | 714/752 |
| 7,406,654 B2 | 7/2008 | Moriwaki | |
| 7,475,324 B2 | 1/2009 | Nagai | |
| 7,523,376 B2 * | 4/2009 | Hsueh et al. .................. | 714/752 |
| 7,551,840 B2 | 6/2009 | Abe | |
| 7,580,211 B2 * | 8/2009 | Tsai ................................ | 360/48 |
| 7,640,483 B2 * | 12/2009 | Ariyama ....................... | 714/769 |
| 7,689,103 B2 * | 3/2010 | Hayashi ........................ | 386/263 |
| 7,836,375 B2 * | 11/2010 | Ariyama ....................... | 714/755 |
| 2006/0072908 A1 | 4/2006 | Ho | |

FOREIGN PATENT DOCUMENTS

| CN | 1534622 A | 10/2004 |
|---|---|---|
| TW | 200419339 | 10/2004 |
| TW | I242186 | 10/2005 |

\* cited by examiner

*Primary Examiner* — Esaw Abraham
(74) *Attorney, Agent, or Firm* — Winston Hsu; Scott Margo (57) ABSTRACT

An EDC generating circuit includes a memory unit, an EDC generating module, a header generator and an EDC correcting circuit. The EDC generating module, which is coupled to the memory unit, is used for generating a first EDC according to at least one main data, and for storing the first EDC to the memory unit. The header generator, which is coupled to the memory unit, is used for generating a header according to header information. The EDC correcting circuit, which is coupled to the memory unit, is used for reading the first EDC from the memory unit and for correcting the first EDC according to the header to generate a second EDC.

10 Claims, 8 Drawing Sheets

EDC GENERATING CIRCUIT AND EDC GENERATING METHOD CORRECTING EDC GENERATED FROM MAIN DATA ACCORDING TO HEADER

BACKGROUND OF THE INVENTION

1. Field of the Invention

The present invention relates to an error detection code generating circuit, an encoding circuit utilizing which and related methods thereof, and particularly relates to an optical data error detection code generating circuit, an encoding circuit utilizing which and related methods thereof.

2. Description of the Prior Art

Figure 1:
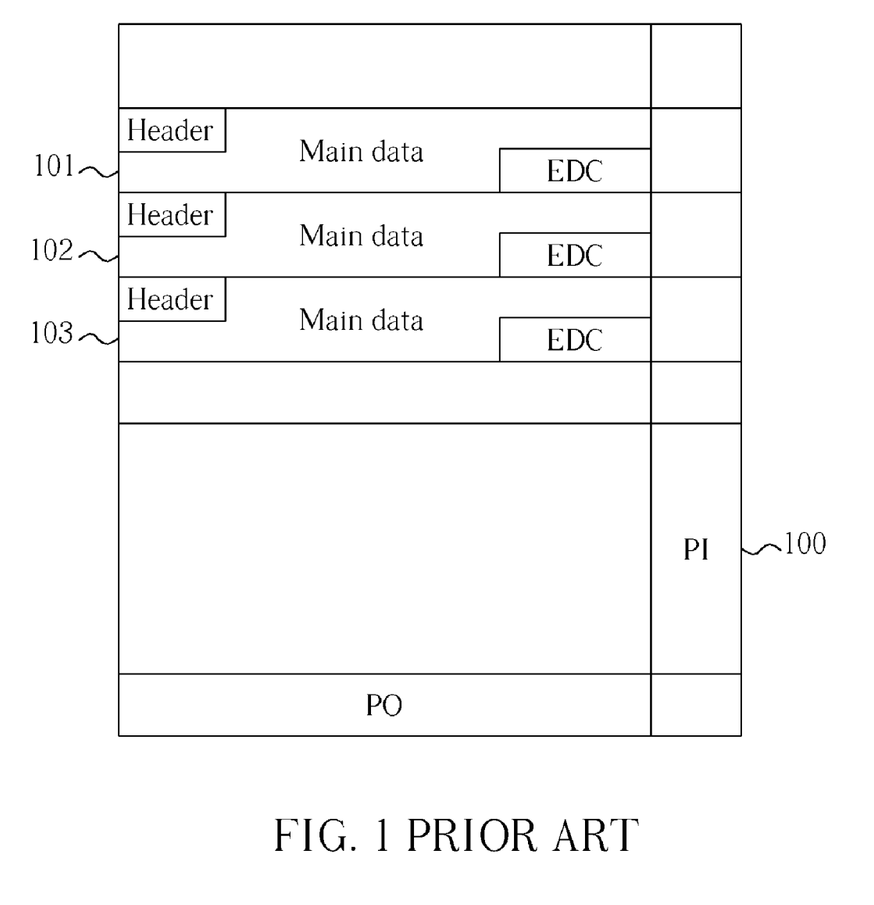
FIG. 1 is a schematic diagram illustrating the ECC block in a DVD optical disc.

Conventionally, a DVD optical disc comprises continuous error correction code block (ECC block), and a DVD optical disc includes at least 143500 ECC blocks, which is illustrated as conform tos. FIG. 1 is a schematic diagram illustrating the ECC block 100 in a DVD optical disc. As shown in FIG. 1, each ECC block has 208 (192+16) rows, and each of them has 182 bytes (172+10). The first 172 bytes of each row is used for storing data to be recorded to the optical disc, and the information stored in the last 10 bytes is the PI (Parity of the Inner code). Also, the last 16 rows of each ECC block are called PO (Parity of the Outer code). Briefly, PI and PO are the checking codes for reading data recoded to the optical disc correctly. One method to generate PI and PO is utilizing Reed-Solomon codes.

Besides, the ECC block 100 includes 16 sectors (only sectors 101, 102, and 103 are illustrated). Each sector includes 2048 bytes of main data, 12 bytes of header and 4 bytes of error detection code (EDC). The header always includes 1 byte of sector information, 3 bytes of ID number, 2 bytes of IED (the EDC, error detection code, of the ID number), and 6 bytes of other information (CPRMAI).

Conventionally, an optical encoding system has a memory unit, a bus, a transmitting interface, a scrambler, a header generator, an EDC generator and an encoder, wherein the transmitting interface, the scrambler, the header generator, the EDC generator and the encoder are respectively coupled to the memory unit. The transmission interface can be ATAPI (Advanced Technology Attachment/ATA packet Interface, which is instituted by team X3T1Q of American National Standards Institute). The transmission interface is utilized to receive main data and transmit it to the memory unit; the scrambler is utilized for scrambling the main data; the header generator is utilized for receiving head information to generate a header, the EDC generator is utilized for generating EDC according to the main data and header; and the encoder is utilized to perform encoding for PI/PO encoding according to the header, main data and EDC. The disadvantage of such a system is that the scrambler must read and write back data of whole sector, and therefore, large bandwidth is needed. Additionally, according to structure of the optical disc encoding system, the EDC generator needs to read a whole sector to generate only 4 bytes EDC, which is inefficient.

SUMMARY OF THE INVENTION

Therefore, one objective of the present invention is to provide an EDC generating circuit, which can decrease the bandwidth needed for the EDC in the circumstance that the transmission interface and the header generator are independent.

Another objective of the present invention is to provide an encoding circuit, which can utilize minimum bandwidth for the EDC in the circumstance that the transmission interface and the header generator are independent.

One embodiment of the present invention discloses an EDC generating circuit, which comprises: a memory unit, an EDC generating module, a header generator and an EDC correcting circuit. The EDC generating module, which is coupled to the memory unit, is used for generating a first EDC according to at least one main data, and for storing the first EDC to the memory unit. The header generator, which is coupled to the memory unit, is used for generating a header according to header information. The EDC correcting circuit, which is coupled to the memory unit, is used for reading the first EDC from the memory unit and for correcting the first EDC according to the header to generate a second EDC.

Another embodiment of the present invention discloses an EDC generating method, which comprises generating a first EDC according to at least one main data, generating a header according to header information, and correcting the first EDC according to the header to generate a second EDC.

In the above-mentioned embodiments, the main data and the header are processed independently, thus the above-mentioned harmonizing problem can be avoided. Also, the EDC generating circuit does not need to read all data from the memory unit, and the bandwidth necessary for data reading can decrease.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the description and following claims to refer to particular components. As one skilled in the art will appreciate, electronic equipment manufacturers may refer to a component by different names. This document does not intend to distinguish between components that differ in name but not function. In the following description and in the claims, the terms "include" and "comprise" are used in an open-ended fashion, and thus should be interpreted to mean "include, but not limited to . . . ". Also, the term "couple" is intended to mean either an indirect or direct electrical connection. Accordingly, if one device is coupled to another device, that connection may be through a direct electrical connection, or through an indirect electrical connection via other devices and connections.

Figure 2:
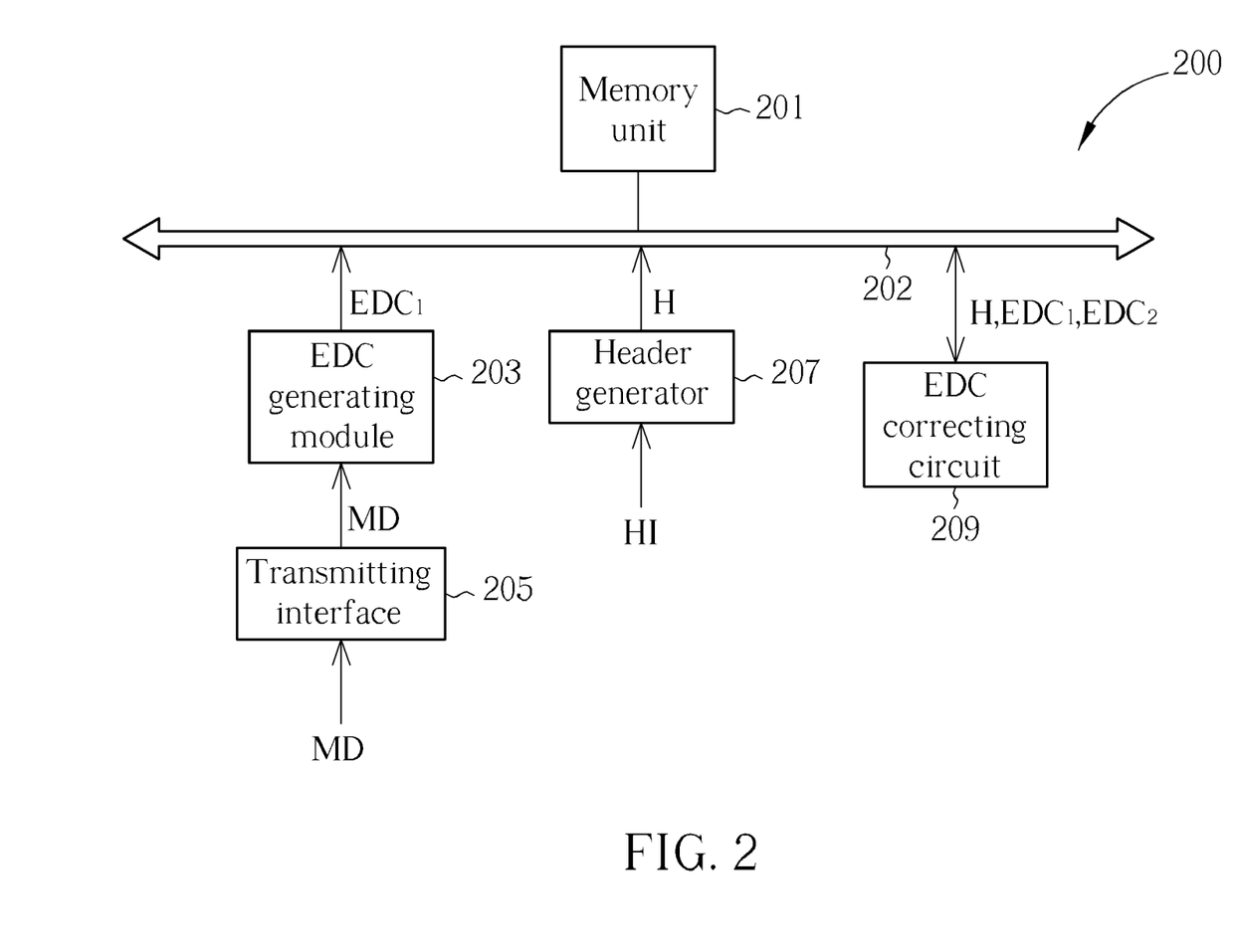
FIG. 2 is an optical disc data EDC generating circuit according to a first embodiment of the present invention.

FIG. 2 is an optical disc data EDC generating circuit 200 according to a first embodiment of the present invention. As shown in FIG. 2, the optical disc data EDC generating circuit 200 includes a memory unit 201, a bus 202, an EDC generating module 203, a transmitting interface 205, a header generator 207 and an EDC correcting circuit 209. The transmitting interface 205 is used for receiving main data MD. The EDC generating module 203, which is coupled to the memory unit 201 via the bus 202, is used for generating a first EDC (EDC.sub.1) according to at least one main data MD, and for storing EDC.sub.1 to the memory unit 201. The header generator 207, which is coupled to the memory unit 201, is used for generating a header H according to header information Hi. The EDC correcting circuit 209, which is coupled to the memory unit 201, is used for reading the EDC.sub.1 from the memory unit 201 and for correcting the EDC.sub.1 according to the header H to generate a second EDC (EDC.sub.2).

Besides above-mentioned operations, the EDC generating module 203 can further combine the main data MD and a substitute data Z of the header H to generate a first data, and generate the EDC.sub.1 according to the first data. Furthermore, the EDC correcting circuit 209 combines the main data MD and the substitute data Z of the header H to generate a second data, and amends the EDC.sub.1 according to the second data to generate EDC.sub.2. If the substitute data Z equals 0, it can be regarded that no substitute data is added.

The operation of the optical disc data EDC generating circuit 200 is explained via FIG. 2 and the following equations. It should be noted that the following equations are only examples and do not mean to limit the scope of the present invention. Persons skilled in the art can freely change the equation to obtain substantially the same function under the concept of the present invention, which should also fall in the scope of the present invention.

$$F(x) = \text{main\_data}(x) \oplus \text{header}(x)$$

$$M(X) = z(x) \oplus \text{main\_data}(x)$$

$$H(x) = z(x) \oplus \text{header}(x)$$

$$F(x) = M(x) \oplus H(X)$$

$$\begin{aligned}EDC(x) &= F(x) \bmod P(x) \\ &= (M(x) \oplus H(x)) \bmod P(x) \\ &= [M(x) \bmod P(x)] \oplus [H(x) \bmod P(x)] \\ &= \text{EDC\_m}(x) \oplus \text{EDC\_h}(x)\end{aligned}$$

In these equations, F(x) is assumed to be a multinomial for EDC encoding, which can include main_data (x) (main data MD) and header (x) (header H). Before a correct header is obtained, the EDC generating module 203 adds a random z(x) (i.e. the substitute data Z) to correct main_data (x) and divides the combination with a predetermined multinomial P(x), such that an EDC_m(x) (i.e. EDC.sub.1) is obtained and is stored to the memory unit 201. After the header generator 207 obtains the correct H (header (x)) according to the header information Hi, the EDC correcting circuit 209 adds the same substitute data z(x) to the header (x), and the combination is also divided by the predetermined multinomial P(x) to obtain EDC_h(x). Finally, an XOR operation is performed on the EDC_m(x) and EDC_h(x), with the effect of Z(x) being cancelled out by the XOR operation, such that a correct EDC(x) (I.e. EDC.sub.2) can be generated by an XOR operation on EDC_m(x) and EDC_h(x). If the added Z(x)=0, H(x)=header (x), and M(x)=main_data (x), then it can be regarded that no Z(x) is added.

According to this mechanism, the transmitting interface 206 and the header generator 207 can operate in parallel, and the interface can utilize a DMA port, which is suited for communications over IP addressing. Also, the EDC generating module 203 does not need to read all data (2060 bytes), but only needs to read the ID field (12 bytes) and the EDC_m (x) (4 bytes), and writes back the correct EDC (x) (4 bytes) after correcting, and thereby 2044 bytes of accessing operation can be saved.

Figure 3:
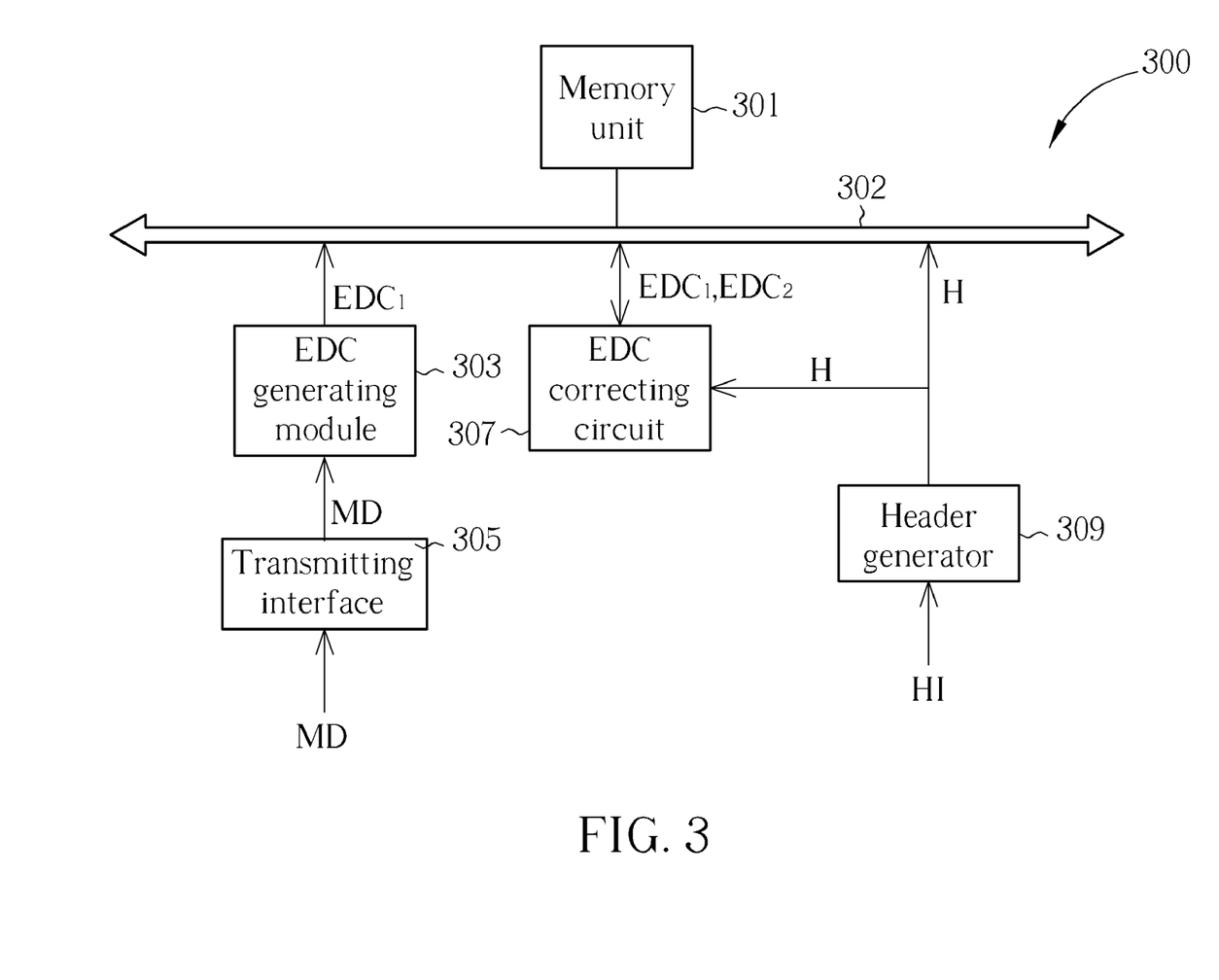
FIG. 3 is an optical disc data EDC generating circuit according to a second embodiment of the present invention.

FIG. 3 is an optical disc data EDC generating circuit 300 according to a second embodiment of the present invention. The optical disc data EDC generating circuit 300 includes a memory unit 301, a bus 302, an EDC generating module 303, a transmitting interface 305, an EDC correcting circuit 307 and a header generator 309. The difference between the optical disc data EDC generating circuits 300 and 200 is that the header generator 309 of the optical disc data EDC generating circuit 300 is further coupled to the EDC correcting circuit 307, therefore the EDC correcting circuit 307 can directly receive the header H from the header generator 309, and amends the EDC.sub.1 according to the header H to generate EDC.sub.2. By this way, the computing and operation time of the header generator 309 can be shortened.

Figure 4:
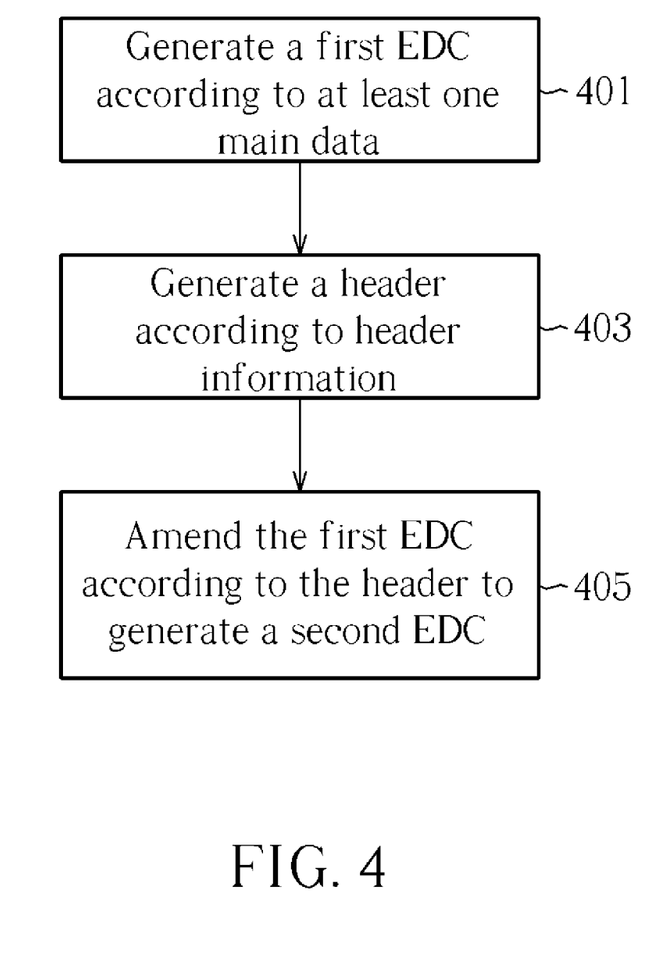
FIG. 4 is an optical disc EDC generating method according to an embodiment of the present invention.

The operation of the optical disc data EDC generating circuits 200 and 300 can be integrated to the steps shown in FIG. 4. FIG. 4 is an optical disc EDC generating method according to an embodiment of the present invention, which includes:

Step 401

Generate a first EDC according to at least one main data.

Step 403

Generate a header according to header information.

Step 405

Amend the first EDC according to the header to generate a second EDC.

Since the method corresponds to the optical disc data EDC generating circuits 200 and 300, the detailed characteristics can be obtained by the above-mentioned description, and thus is omitted for brevity.

Figure 5:
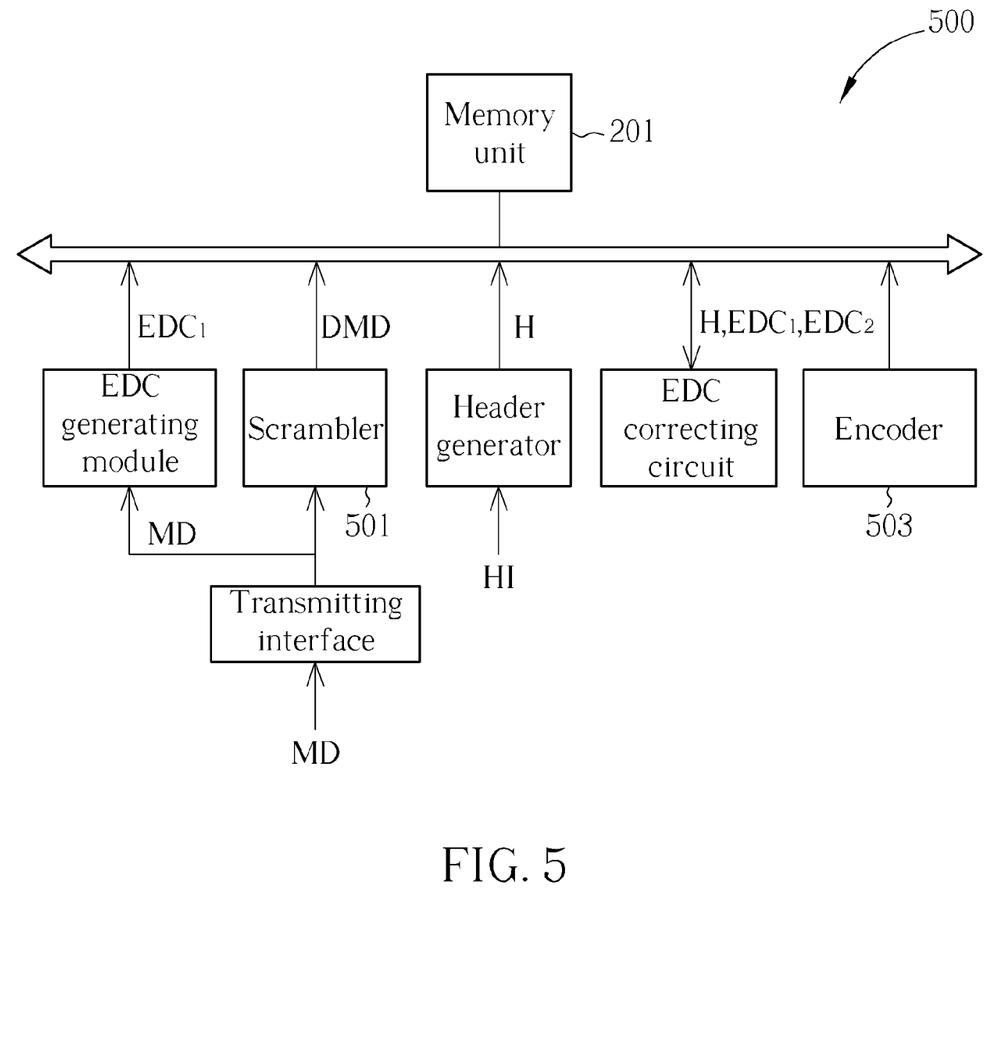
FIG. 5 is an optical data encoding system according to a first embodiment of the present invention.

FIG. 5 is an optical data encoding system 500 according to a first embodiment of the present invention. The optical data encoding system 500 corresponds to the optical disc data EDC generating circuits 200 shown in FIG. 2. Besides the optical disc data EDC generating circuits 200 shown in FIG. 2, the optical data encoding system 500 further includes a scrambler 501 and an encoder 503. The scrambler 501 receives main data MD, and scrambles main data MD to generate scrambled main data DMD and stores scrambled main data DMD to the memory unit 201. Also, the encoder 503 encodes according to scrambled main data DMD, header H and $EDC_2$ to generate PI, PO.

Figure 6:
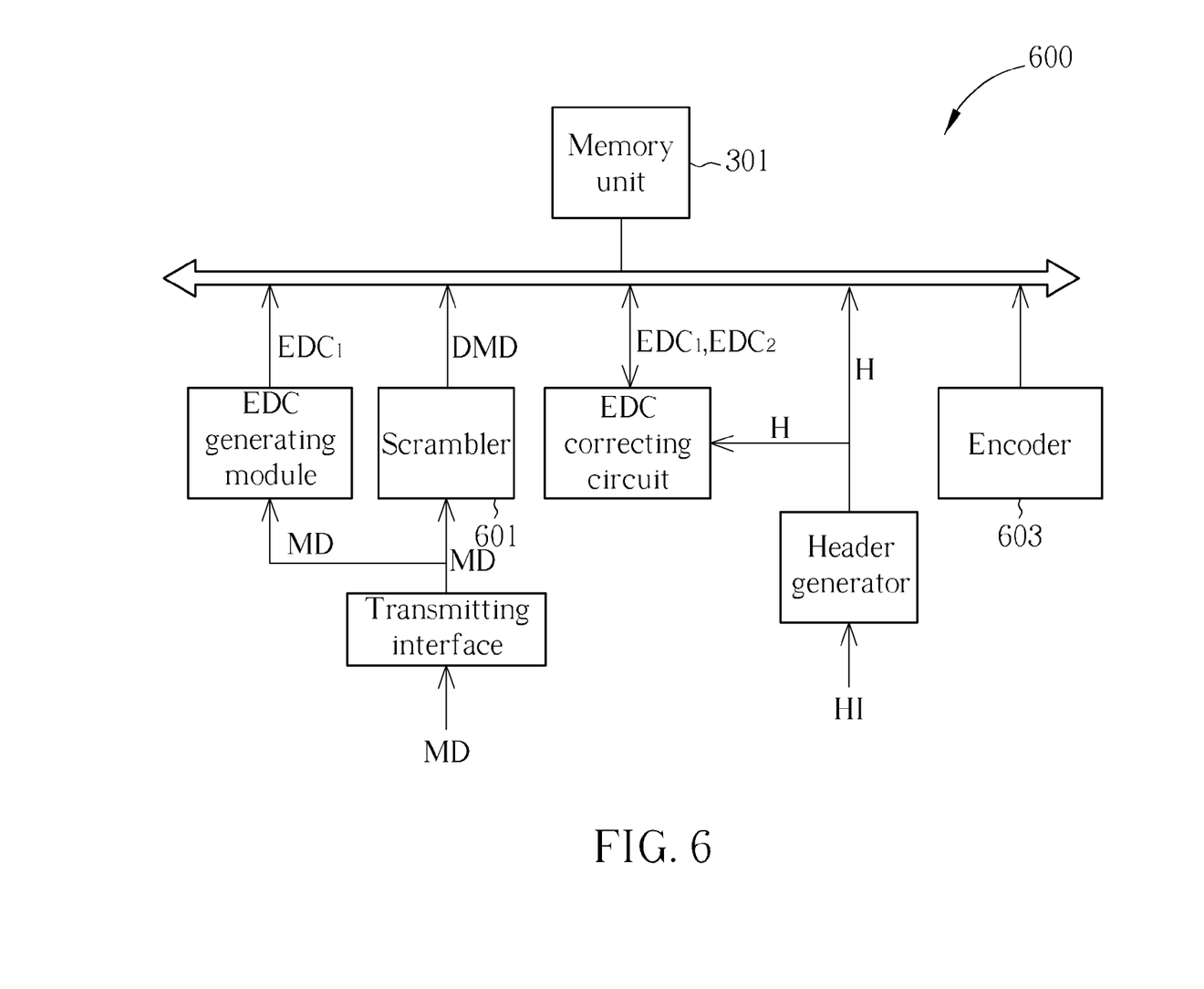
FIG. 6 is an optical data encoding system according to a second embodiment of the present invention.

FIG. 6 is an optical data encoding system 600 according to a second embodiment of the present invention. The optical data encoding system 600 corresponds to the optical disc data EDC generating circuits 300 shown in FIG. 3. Similarly, the difference between the optical data encoding system 600 and the optical disc data EDC generating circuits 300 is that the optical data encoding system 600 further includes a scrambler 601 and an encoder 603. The scrambler 601 receives main data MD, and scrambles main data MD to generate scrambled main data DMD and stores scrambled main data DMD to the memory unit 301. Also, the encoder 603 encodes according to scrambled main data DMD, header H and $EDC_2$ to generate PI, PO.

Figure 7:
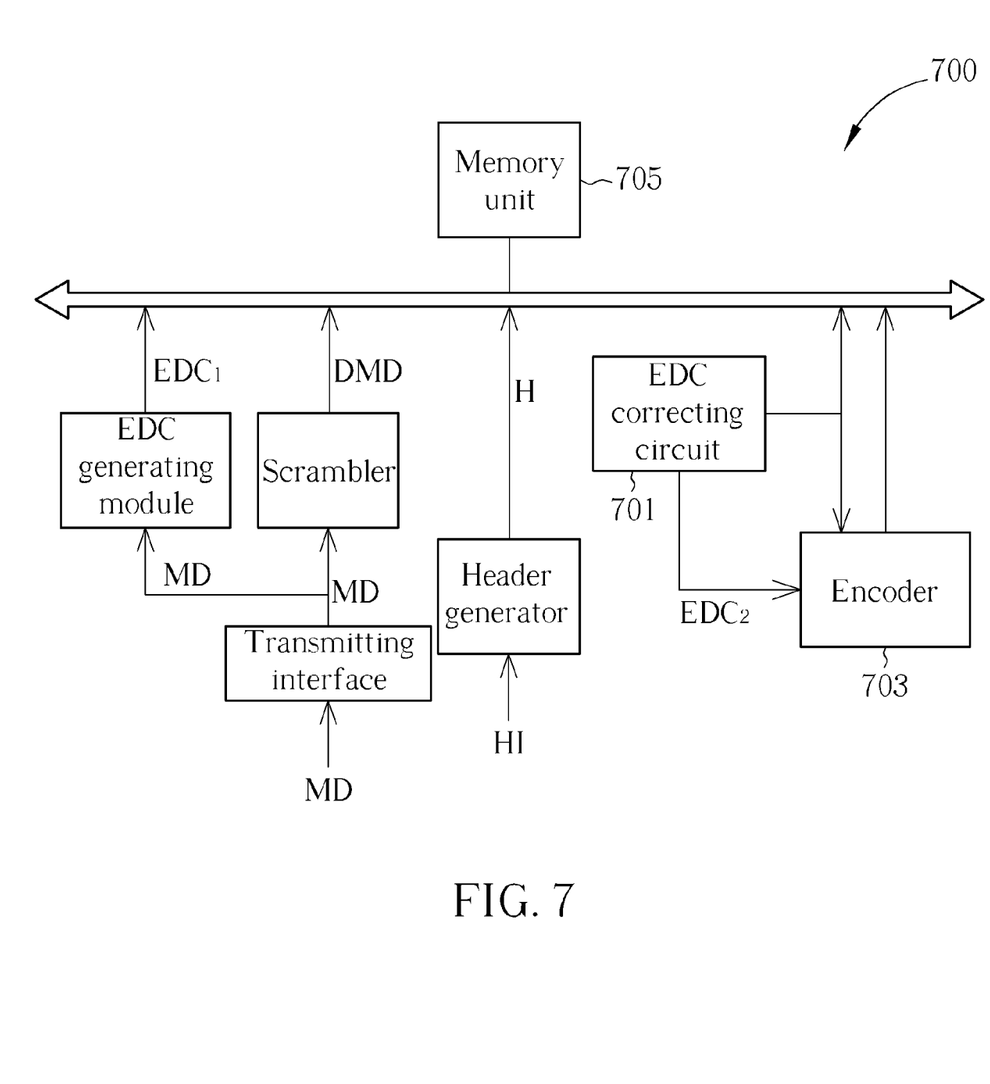
FIG. 7 is an optical data encoding system according to a third embodiment of the present invention.

FIG. 7 is an optical data encoding system 700 according to a third embodiment of the present invention. The optical data encoding system 700 includes the same elements as the optical data encoding systems 500 and 600, but has different connection types. As shown in FIG. 7, the EDC correcting circuit 701 is coupled to the encoder 703. Thus the $EDC_1$ and the header H are stored in the memory unit 705 in this embodiment, then the EDC correcting circuit 701 reads the $EDC_1$ and the header H from the memory unit 705, and amends the $EDC_1$ according to the header H to generate the $EDC_2$. The encoder 703 encodes according to scrambled main data DMD, header H and $EDC_2$ to generate PI, PO. Please note that the EDC correcting circuit 701 finishes the operation of correcting EDC before the encoder 703 utilizes the $EDC_2$ to perform PI/PO encoding.

Figure 8:
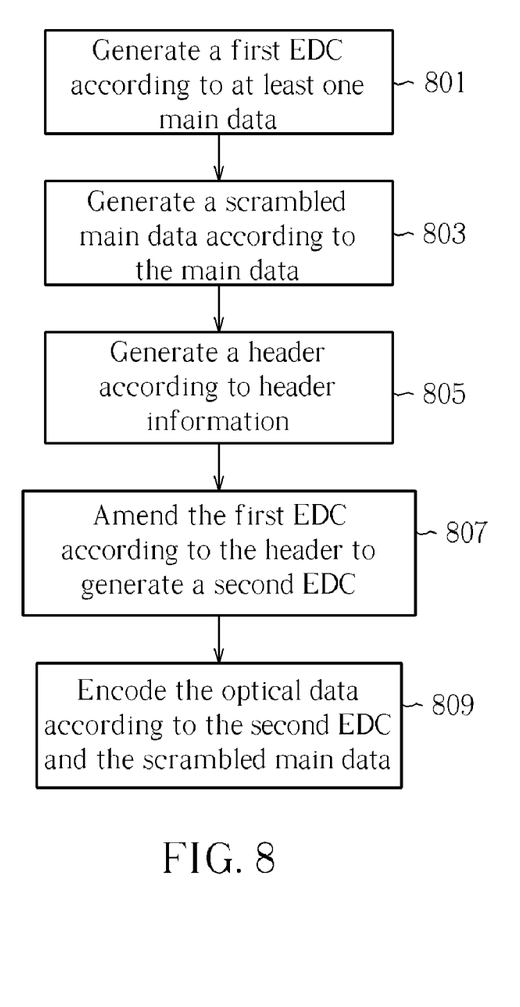
FIG. 8 is an optical data encoding method according to a third embodiment of the present invention.

FIG. 8 is an optical data encoding method according to a third embodiment of the present invention, which corresponds to the circuits shown in FIG. 5 to FIG. 7. The method includes:

Step 801

Generate a first EDC according to at least one main data.

Step 803

Generate a scrambled main data according to the main data.

Step 805

Generate a header according to header information.

Step 807

Amend the first EDC according to the header to generate a second EDC.

Step 809

Encode the optical data according to the second EDC and the scrambled main data.

Since the method corresponds to the optical disc data EDC generating circuits 500, 600 and 700, the detailed characteristics can be obtained by the above-mentioned description, and thus are omitted for brevity.

In the above-mentioned embodiments, a substitute data Z is utilized to substitute a correct header temporarily (i.e., a substitute header substituting the correct header) to generate a temporary EDC. Also, the effect of the substitute header is removed to generate correct EDC after the correct header is obtained. Since main data and header are processed in parallel, the above-mentioned harmonizing problem can be avoided. Besides, the EDC generating circuit does not need read whole data from the memory unit, such that the bandwidth used for reading data can be saved. It should be noted that a DVD is utilized in the above mentioned embodiments as an example, but it does not mean to limit the scope of the present invention. The circuit and method according to the embodiments of the present invention can be utilized to other types of optical discs, of course, and can be utilized to data besides optical disc data, too. Such variations should also fall in the scope of the present invention.

Those skilled in the art will readily observe that numerous modifications and alterations of the device and method may be made while retaining the teachings of the invention.

What is claimed is:

1. An error detection code (EDC) generating circuit, comprising:
    a memory unit;
    an EDC generating module, coupled to the memory unit, for generating a first EDC according to at least one main data, and for storing the first EDC to the memory unit;
    a header generator, coupled to the memory unit, for generating a header according to header information; and
    an EDC correcting circuit, coupled to the memory unit, for reading the first EDC from the memory unit and for correcting the first EDC according to the header to generate a second EDC.

2. The EDC generating circuit of claim 1, wherein the EDC generating module further generates a first data according to the main data and a substitute data of the header, and generates the first EDC according to the first data.

3. The EDC generating circuit of claim 2, wherein the EDC correcting module generates a second data according to the header and the substitute data, and amends the first EDC according to the second data to generate the second EDC.

4. The EDC generating circuit of claim 1, wherein the main data and the header conform to a DVD standard.

5. The EDC generating circuit of claim 1, wherein the header generator is coupled to the memory unit and stores the header to the memory unit, where the EDC correcting circuit further reads the header from the memory unit, and amends the first EDC according to the header to generate the second EDC.

6. The EDC generating circuit of claim 1, wherein the EDC correcting module is further coupled to the header generator, and the EDC correcting circuit receives the header from the header generator and amends the first EDC according to the header to generate the second EDC.

7. The EDC generating circuit of claim 1, wherein the EDC generating module is coupled to the memory unit via a bus.

8. An error detection code (EDC) generating method, comprising:
    generating a first EDC according to at least one main data;
    generating a header according to header information; and
    correcting the first EDC according to the header to generate a second EDC.

9. The EDC generating method of claim 8, wherein the step of generating the first EDC further comprises:
    generating a first data according to the main data and a substitute data of the header; and
    generating the first EDC according to the first data.

10. The EDC generating method of claim 9, wherein the step of generating the second EDC further comprises:
    generating a second data according to the header and the substitute data; and
    correcting the first EDC according to the second data to generate the second EDC.

* * * * *